(12) United States Patent
Wegleiter et al.

(10) Patent No.: US 6,828,597 B2
(45) Date of Patent: Dec. 7, 2004

(54) RADIATION-EMITTING SEMICONDUCTOR COMPONENT

(75) Inventors: Walter Wegleiter, Nittendorf (DE); Klaus Streubel, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 226 days.

(21) Appl. No.: 10/237,472

(22) Filed: Sep. 9, 2002

(65) Prior Publication Data
US 2003/0062821 A1 Apr. 3, 2003

(30) Foreign Application Priority Data
Sep. 28, 2001 (DE) .......................................... 101 47 887

(51) Int. Cl.[7] .............................................. H01L 29/22
(52) U.S. Cl. .............................. 257/99; 257/91; 257/93; 257/98
(58) Field of Search .............................. 257/99, 91, 93, 257/98; 438/22

(56) References Cited

U.S. PATENT DOCUMENTS

| | | | | |
|---|---|---|---|---|
| 3,790,868 A | * | 2/1974 | Soshea | 257/98 |
| 3,990,101 A | * | 11/1976 | Ettenberg et al. | 136/255 |
| 4,072,541 A | * | 2/1978 | Meulenberg et al. | 136/255 |
| 4,156,963 A | * | 6/1979 | Tsuji et al. | 438/121 |
| 4,232,440 A | * | 11/1980 | Bastek | 438/26 |
| 4,295,002 A | * | 10/1981 | Chappell et al. | 136/244 |
| 4,618,877 A | * | 10/1986 | Araki et al. | 257/147 |
| 4,885,630 A | * | 12/1989 | Temple | 257/150 |
| 4,918,514 A | * | 4/1990 | Matsuda et al. | 257/623 |
| 5,472,914 A | * | 12/1995 | Martin et al. | 438/59 |
| 5,767,581 A | | 6/1998 | Nakamura et al. | |
| 5,917,202 A | | 6/1999 | Haitz et al. | |
| 5,977,566 A | * | 11/1999 | Okazaki et al. | 257/99 |
| 6,166,320 A | * | 12/2000 | Nagashima et al. | 136/249 |
| 6,291,839 B1 | | 9/2001 | Lester | |
| 6,465,808 B2 | * | 10/2002 | Lin | 257/81 |

FOREIGN PATENT DOCUMENTS

| | | |
|---|---|---|
| DE | 196 48 309 | 7/1997 |
| DE | 199 27 945 | 3/2000 |
| JP | 61-263289 | 11/1986 |

* cited by examiner

Primary Examiner—Tom Thomas
Assistant Examiner—Eugene Lee
(74) Attorney, Agent, or Firm—Schiff Hardin LLP

(57) ABSTRACT

In a radiation-emitting semiconductor component having a semiconductor body that comprises a radiation-generating active layer, having a central front-side contact on a front side of the semiconductor body and a back-side contact on a back side of the semiconductor body for impressing a current into the semiconductor body containing the active layer, the back-side contact comprises a plurality of contact locations spaced from one another, whereby the size of the contact locations increases with increasing distance from the central front-side contact.

9 Claims, 2 Drawing Sheets

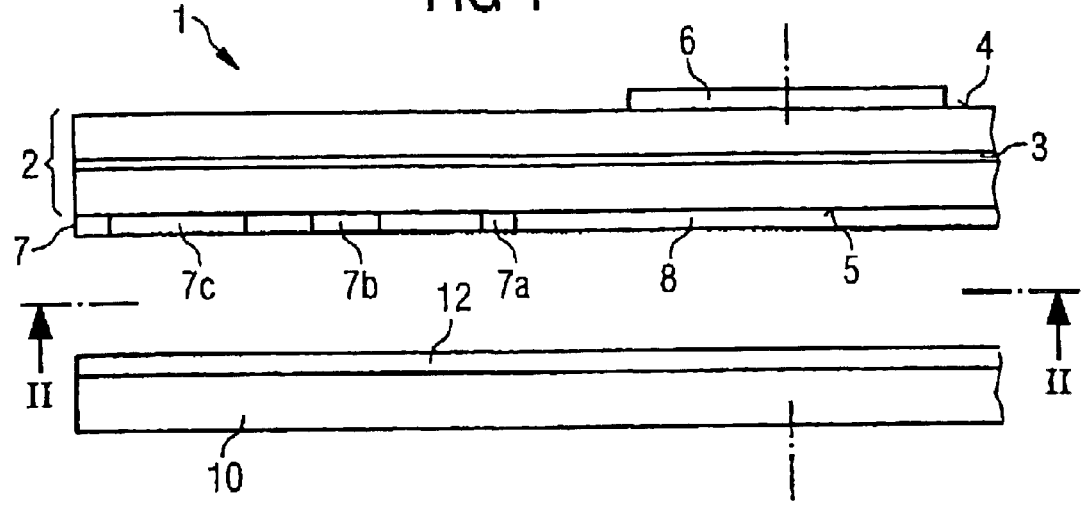
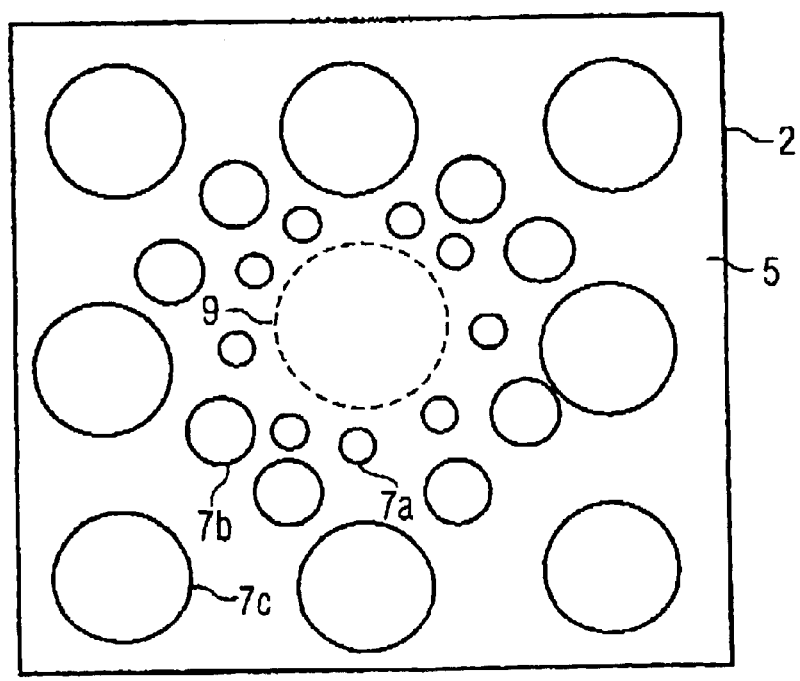

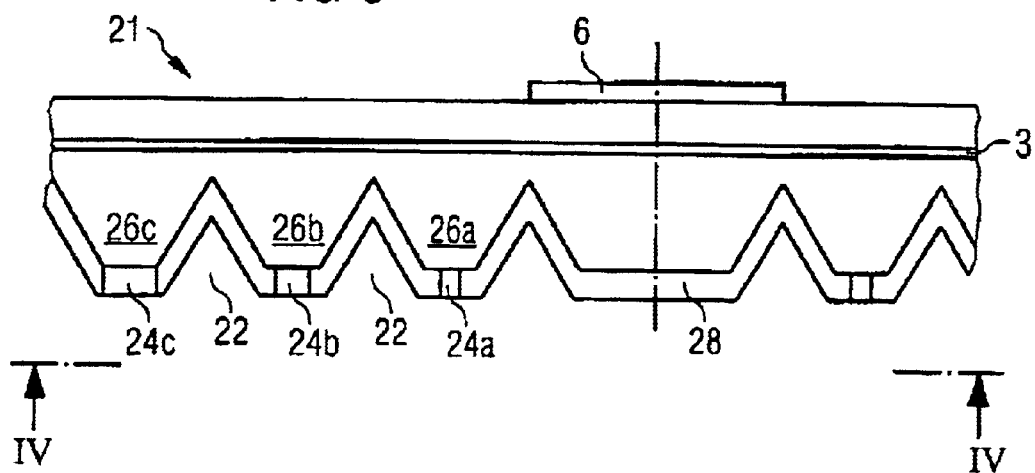
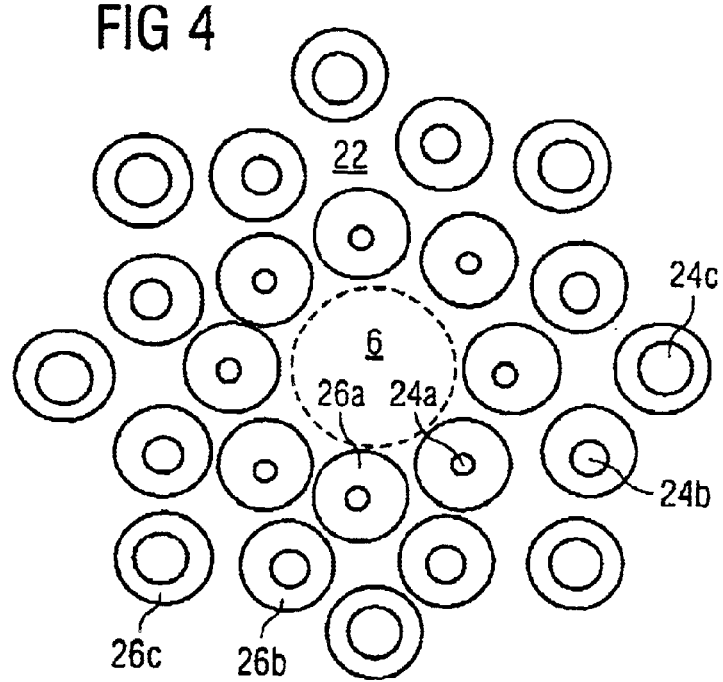

RADIATION-EMITTING SEMICONDUCTOR COMPONENT

BACKGROUND OF THE INVENTION

1. Field of the Invention

The invention is directed to a radiation-emitting semiconductor component having a semiconductor body that comprises a radiation-generating active layer, having a central front-side contact on a front side of the semiconductor body and a back-side contact on a back side of the semiconductor body for impressing a current into the semiconductor body containing the active layer.

2. Description of the Related Art

In light-emitting diodes, the current for operating the light-emitting diode is usually sent from a central contact on the upper side through the semiconductor to a surface-wide back-side contact. A fundamental problem is how to distribute the current density in the light-generating layer as uniformly as possible onto the entire chip area.

For solving this problem, one or more current-expanding layers are applied on the chip surface between the active zone and the central contact. The current-expanding is set using a suitable selection of the layer thickness and of the electrical properties of the expanding layers.

The current-expanding layers are usually composed of p-doped GAP in the case of light-emitting diodes that are based on the InGaAlP material system In the manufacture of thin-film LEDs, the window layer is usually grown onto the substrate before the active layer and becomes the upper side of the LED only after the transfer onto a new carrier and the stripping of the substrate. Due to the great difference in the lattice constants of about 4%, however, it is currently not possible to deposit active layers of sufficient quality on GAP. This makes the manufacture of InGaAlP thin-film LEDs with current-expanding layers difficult.

Other proposed solutions are to provide structured contact patterns or transparent contacts such as thin metal layers or contacts of indium tin oxide (ITO). Each of these solutions, however, has disadvantages. A metal layer exhibits a light absorption that cannot be neglected, whereas a contact layer of ITO generally forms a relatively poor electrical contact to the semiconductor.

Up to now, for example, very thin, semi-transparent contact layers were employed for the terminal contacts, as disclosed, for instance, by U.S. Pat. No. 5,767,581 on a semiconductor chip on the basis of InAlGaN. In order to assure a high transparency of the terminal contacts, the semi-transparent layers must be fashioned optimally thin. This is opposed by the demand for adequate homogeneity, adequate shunt conductivity and low contact resistance. The semitransparent contact layers employed for traditional light-emitting diodes therefore necessarily absorb a large part of the light emerging through the surface.

Over and above this, the known optoelectronic components on the basis of InAlGaN with semi-transparent contacts can fail given a high thermal/electrical load due to a degradation of the contact layer.

Furthermore, German Patent Document DE 1 99 27 945 A1 discloses that a contact layer having a thickness of 1000 through 30000 Å be applied onto the p-doped layer of a light-emitting diode on the basis of InAlGaN. Openings having a width of 0.5 through 2 µm are introduced in this contact layer in order to enable an improved light transmission through the contact layer.

SUMMARY OF THE INVENTION

The present invention is based on the object of providing a radiation-emitting semiconductor component of the species initially cited that avoids the disadvantages of the prior art. In particular, an adequately large-area impression of current into the light-generating layer should be achieved for systems in which the application of high-quality active layers on current-expanding layers takes on a difficult and complicated form.

This object is achieved by a radiation-emitting semiconductor component having a semiconductor body, the semiconductor body comprising a radiation-generating active layer, a central front-side contact on a front side of the semiconductor body, a back-side contact on a back side of the semiconductor body for impressing a current into the semiconductor body containing the active layer, the back-side contact comprises a plurality of contact locations spaced from one another, a size of the contact locations increasing with increasing distance from the central front-side contact.

Advantageous developments include having the size of the contact locations and a spacing of the contact locations from one another are selected such that a flow of current through the active layer is essentially homogeneous during operation. The contact locations may be formed by circular or rectangular contact points of different diameter or width. A majority of spaced contact locations may contain several groups of contact locations of a respectively same size, these contact locations of each group being arranged with essentially the same spacing from the central front-side contact and concentrically around a common mid-point on a back side of the semiconductor body. An insulation layer may be used to separate the spaced contact locations. Trenches may be introduced in the semiconductor body that separate the spaced contact locations. The component may comprise a plurality of spaced conical or pyramidal frustums introduced into a back side of the semiconductor body, respective contact locations being arranged on their cover surfaces. A size of the conical or pyramidal frustums may be constant and an area of the contact locations arranged on the cover surfaces may increase with increasing distance from the central front-side contact. Finally, the component may be configured such that the contact locations can be electrically contacted via a carrier for eutectic bonding that is provided with bond metal. More details of the embodiments are described below.

Inventively, the back-side contact in a radiation-emitting semiconductor component of the species is designed such that is comprises a plurality of contact locations spaced from one another in which the size of the contact locations increases with increasing distance from the central front-side contact.

The invention is thus based on the idea of replacing the traditional, surface-wide back-side contact with a non-uniform distribution of contact locations. The intermediate resistance is varied with the size of the contact locations.

Since the size of the contact locations inventively increases with increasing distance from the central front-side contact, the resistance is higher in the center of the semiconductor body and drops toward the edge of the semiconductor body. A desired current profile can thus be set by the selection of size and spacing of the contact locations.

Preferably, the size of the contact locations and the spacing of the contact locations from one another are selected such that the flow of current through the active layer is essentially homogeneous during operation.

The contact locations are preferably formed by contact points having an arbitrary shape. Especially advantageous developments include having the contact locations formed by circular or rectangular contact points of different diameters or widths.

It is especially advantageous when the majority of spaced contact locations contains several groups of contact locations of the respectively same size and where the contact locations of each group are arranged with essentially the same spacing from the central front-side contact and concentrically around a common mid-point on the back side of the semiconductor body.

According to a preferred embodiment, the spaced contact locations are separated from one another by an insulation layer.

Alternatively or additionally, the spaced contact locations can also be separated from one another by trenches introduced in the semiconductor body. To that end, a plurality of spaced conical or pyramidal frustums can be introduced into the back side of the semiconductor body with respective contact locations being arranged on their cover surfaces.

In particular, the size of the conical or pyramidal frustums may be constant and the area of the contact locations arranged on the cover surfaces may increase with increasing distance from the central front-side contact.

The contact locations are preferably electrically contacted via a carrier for eutectic bonding that is provided with bond metal.

DESCRIPTION OF THE DRAWINGS

The invention is be set forth in greater detail below on the basis of exemplary embodiments in conjunction with the drawings. Shown are:

FIG. 1 is a section view through a component according to an exemplary embodiment of the invention;

FIG. 2 is a plan view onto the back-side contact of the component of FIG. 1 in the direction II—II;

FIG. 3 is a section view of a section through a component according to a further exemplary embodiment of the invention; and FIG. 4 is a plan view onto the back-side contact of the component of FIG. 3 in the direction IV—IV.

DETAILED DESCRIPTION OF THE INVENTION

FIG. 1 shows a section through a thin-film LED referenced 1 overall. The semiconductor body 2 of the thin-film LED contains an active layer 3, for example on a basis of InGaAlP.

For impressing current, a central front-side contact 6 is applied on the upper side 4 of the semiconductor body 2 and a back-side contact 7 is applied on the back side 5 of the semiconductor body.

In order to achieve a uniform current density in the active layer 3, the back-side contact 7 is composed of a number of circular contact points 7a–7c that are electrically insulated from one another by an insulation layer 8.

As can best be seen in FIG. 2, the back-side contact 7 in the exemplary embodiment is composed of three groups of contact points, where the contact points of each group respectively comprise the same diameter. The contact points 7a of the first group are arranged along the periphery 9 of the projection of the central front-side contact 6 onto the back side 5 of the semiconductor body. This group of contact points 7a has the smallest diameter of all contact points but the highest resistance.

A second group of contact points 7b with a larger diameter is arranged beyond this first group. The contact points 7c of the third group are in turn located beyond the second group, the contact points of this third group comprising the largest diameter. The resistance of the contact points decreases with increasing diameter, so that an increasing part of the current flow flows via the lower-impedance current paths that the larger contact points offer.

It is obvious to a person skilled in the art that an essentially uniform current density profile can be achieved over the entire chip area using a suitable selection of the diameters and of the spacings.

As the arrangement of FIG. 2 shows, the curve on which the contact points of equal size are arranged changes from an approximately circular form in the center (contact points 7a) to an approximately quadratic form (contact points 7c) in order to take both the geometry of the circular front-side contact 6 as well as of the quadratic LED chip in to consideration.

Again with reference to FIG. 1, the contact points can be electrically connected by a carrier for eutectic bonding 10 that is provided with a bond metal 12.

Another exemplary embodiment of a radiation-emitting component 21 is shown in FIGS. 3 and 4. In this embodiment, the back side of the semiconductor body 2 is structured before the bonding process into a pattern of truncated conical frustums 26a–26c that are separated from one another by trenches 22.

The etched structures are connected to contact points 24a–24c whose size—analogous to the above-described embodiment—increases from inside to outside, so that a constant current density is achieved over the area of the active layer 3. Here, too, the individual contact points are electrically insulated from one another by an insulation layer 28.

The conical frustums 26a–26c are preferably spread over the chip area. They can then be designed such in a simple way that they advantageously influence the coupling of the light out of the semiconductor crystal.

In the same way as described in conjunction with FIG. 1, the electrical connection of the contact points 24a–24c can ensue using a carrier for eutectic bonding.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. For the sake of brevity, conventional electronics may not be described in detail. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A radiation-emitting semiconductor component having a semiconductor body, the semiconductor body comprising:
   a radiation-generating active layer,
   a central front-side contact on a front side of the semiconductor body;
   a back-side contact on a back side of the semiconductor body for impressing a current into the semiconductor body containing the active layer, the back-side contact comprises a plurality of contact locations spaced from one another, a size of the contact locations increasing with increasing distance from the central front-side contact.

2. A radiation-emitting semiconductor component according to claim 1, wherein the size of the contact locations and a spacing of the contact locations from one another are selected such that a flow of current through the active layer is essentially homogeneous during operation.

3. A radiation-emitting semiconductor component according to claim 1, wherein the contact locations are formed by circular or rectangular contact points of different diameter or width.

4. A radiation-emitting semiconductor component according to claim 1, wherein a majority of spaced contact locations contain several groups of contact locations of a respectively same size, the contact locations of each group being arranged with essentially the same spacing from the central front-side contact and concentrically around a common mid-point on a back side of the semiconductor body.

5. A radiation-emitting semiconductor component according claim 1, further comprising an insulation layer that separates the spaced contact locations.

6. A radiation-emitting semiconductor component according to claim 1, further comprising trenches introduced in the semiconductor body that separate the spaced contact locations.

7. A radiation-emitting semiconductor component according to claim 6, further comprising a plurality of spaced conical or pyramidal frustums introduced into a back side of the semiconductor body, respective contact locations being arranged on their cover surfaces.

8. A radiation-emitting semiconductor component according to claim 7, wherein a size of the conical or pyramidal frustums is constant and an area of the contact locations arranged on the cover surfaces increases with increasing distance from the central front-side contact.

9. A radiation-emitting semiconductor component according to claim 1, wherein the component is configured such that the contact locations can be electrically contacted via a carrier for eutectic bonding that is provided with bond metal.

* * * * *